United States Patent
Kim et al.

(10) Patent No.: US 11,315,802 B2
(45) Date of Patent: Apr. 26, 2022

(54) METHOD FOR MANUFACTURING SEMICONDUCTOR PACKAGE HAVING REDISTRIBUTION LAYER

(71) Applicant: Samsung Electronics Co., Ltd., Suwon-si (KR)

(72) Inventors: Il Hwan Kim, Hwaseong-si (KR); Un Byoung Kang, Hwaseong-si (KR); Chung Sun Lee, Anyang-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/293,697

(22) Filed: Mar. 6, 2019

(65) Prior Publication Data

US 2020/0066545 A1   Feb. 27, 2020

(30) Foreign Application Priority Data

Aug. 24, 2018   (KR) .................. 10-2018-0099284

(51) Int. Cl.
*H01L 21/48*   (2006.01)
*H01L 21/56*   (2006.01)
(Continued)

(52) U.S. Cl.
CPC ...... *H01L 21/4857* (2013.01); *H01L 21/4853* (2013.01); *H01L 21/56* (2013.01); *H01L 21/6835* (2013.01); *H01L 23/49816* (2013.01); *H01L 24/03* (2013.01); *H01L 24/81* (2013.01); *H01L 23/49822* (2013.01); *H01L 24/05* (2013.01); *H01L 24/13* (2013.01); *H01L 2221/68345* (2013.01); *H01L 2221/68354* (2013.01); *H01L 2221/68368* (2013.01); *H01L 2224/05647* (2013.01);
(Continued)

(58) Field of Classification Search
CPC ............. H01L 21/4846; H01L 21/4853; H01L 21/4857; H01L 21/56; H01L 21/6853; H01L 24/05; H01L 24/13; H01L 24/14; H01L 2221/68345; H01L 2221/68354; H01L 2221/68368; H01L 2224/13147; H01L 21/6835; H01L 2224/81001
See application file for complete search history.

(56) References Cited

U.S. PATENT DOCUMENTS 9,040,390 B2   5/2015   Daubenspeck et al.
9,490,231 B2   11/2016   Ko et al.
(Continued)

FOREIGN PATENT DOCUMENTS

KR   20160020460 A   *   2/2016
KR   10-1760601 B1   7/2017

*Primary Examiner* — Eduardo A Rodela
*Assistant Examiner* — Christopher M Roland
(74) *Attorney, Agent, or Firm* — Muir Patent Law, PLLC

(57) ABSTRACT

A method of manufacturing a semiconductor package includes forming a plurality of trenches at a first surface of a silicon substrate, forming a conductive pad inside each of the plurality of trenches, forming a redistribution layer on the first surface of the silicon substrate, forming an external connection terminal on a first surface of the redistribution layer, removing the silicon substrate to expose each conductive pad, mounting a semiconductor chip to be connected to the conductive pads, and forming an encapsulant to cover at least one surface of the semiconductor chip.

18 Claims, 13 Drawing Sheets

(51) Int. Cl.
  *H01L 23/498* (2006.01)
  *H01L 21/683* (2006.01)
  *H01L 23/00* (2006.01)
(52) U.S. Cl.
  CPC ............. *H01L 2224/08225* (2013.01); *H01L 2224/13147* (2013.01); *H01L 2224/16227* (2013.01); *H01L 2224/32225* (2013.01); *H01L 2224/81001* (2013.01); *H01L 2224/81005* (2013.01); *H01L 2924/15311* (2013.01); *H01L 2924/18161* (2013.01)

(56) References Cited

U.S. PATENT DOCUMENTS

| | | | |
|---|---|---|---|
| 9,748,184 B2 | 8/2017 | Shih et al. | |
| 9,922,845 B1 | 3/2018 | Shih | |
| 2006/0006536 A1* | 1/2006 | Lee | H05K 1/111 |
| | | | 257/738 |
| 2008/0258300 A1* | 10/2008 | Kobayashi | H01L 21/4853 |
| | | | 257/737 |
| 2010/0263923 A1* | 10/2010 | Kodani | H01L 21/4853 |
| | | | 174/260 |
| 2010/0308443 A1* | 12/2010 | Suthiwongsunthorn | H01L 21/561 |
| | | | 257/621 |
| 2016/0064314 A1 | 3/2016 | Lin et al. | |
| 2016/0126226 A1 | 5/2016 | Pei et al. | |
| 2016/0163578 A1* | 6/2016 | Yu | H01L 21/6835 |
| | | | 257/738 |
| 2016/0174365 A1 | 6/2016 | Lin et al. | |
| 2016/0189980 A1 | 6/2016 | Paek et al. | |
| 2016/0358847 A1* | 12/2016 | Shih | H01L 24/92 |
| 2017/0194238 A1* | 7/2017 | Chiang | H01L 23/49827 |
| 2018/0130745 A1* | 5/2018 | Hu | H01L 24/20 |
| 2019/0027451 A1* | 1/2019 | Kim | H01L 23/5283 |
| 2020/0027804 A1* | 1/2020 | Fang | H01L 23/3114 |

* cited by examiner

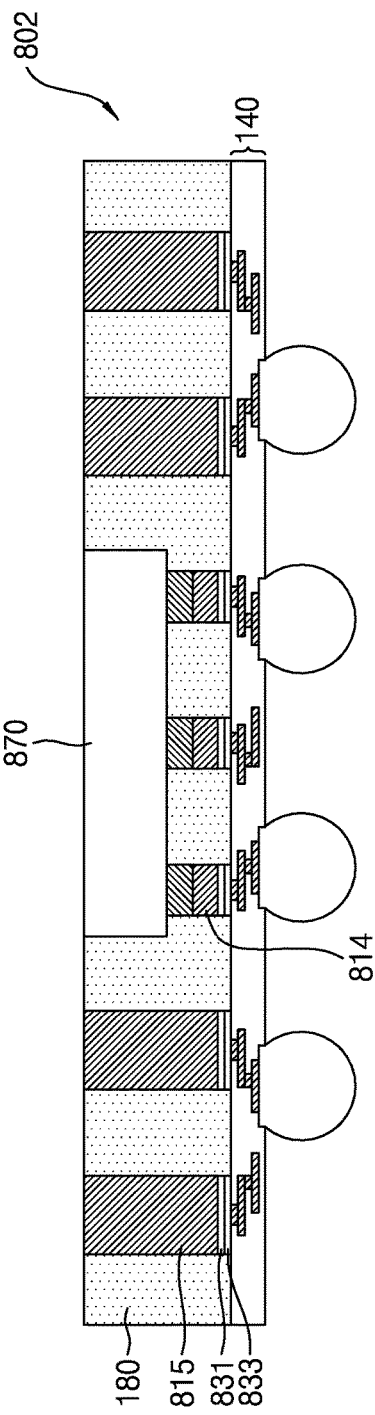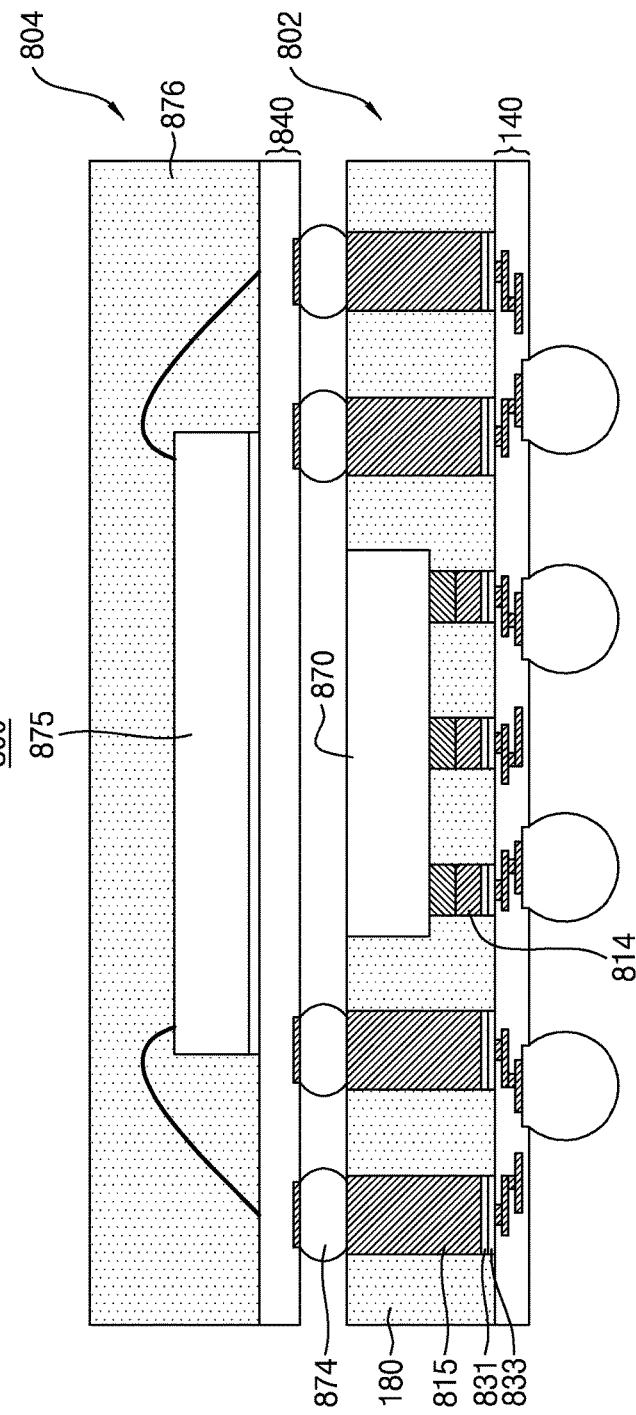

METHOD FOR MANUFACTURING SEMICONDUCTOR PACKAGE HAVING REDISTRIBUTION LAYER

CROSS-REFERENCE TO RELATED APPLICATION

This U.S. non-provisional patent application claims priority under 35 U.S.C. § 119 to Korean Patent Application No. 10-2018-0099284, filed on Aug. 24, 2018, in the Korean Intellectual Property Office (KIPO), the disclosure of which application is incorporated herein by reference in its entirety.

BACKGROUND

1. Field of the Invention

Methods consistent with example embodiments relate to a method of manufacturing a semiconductor package having a redistribution layer.

2. Discussion of Related Art

To reduce the size and weight of electronic devices, a through-silicon via (TSV) technique or a redistribution layer technique has been attempted in semiconductor package technology. Since the manufacture of a TSV and a redistribution layer additionally involves adhering and removing a carrier, it is helpful to simplify a process of manufacturing a semiconductor package.

SUMMARY OF THE INVENTION

The example embodiments of the inventive concept are directed to providing a method of manufacturing a semiconductor package using a simplified manufacturing process.

According to example embodiments, a method of manufacturing a semiconductor package includes forming a plurality of trenches at a first surface of a silicon substrate, forming a conductive pad inside each of the plurality of trenches, forming a redistribution layer on the first surface of the silicon substrate, forming an external connection terminal on a first surface of the redistribution layer, removing the silicon substrate to expose each conductive pad, mounting a semiconductor chip to be connected to the conductive pads, and forming an encapsulant to cover at least one surface of the semiconductor chip.

According to example embodiments, which may include the aforementioned embodiments, a method of manufacturing a semiconductor package includes forming a plurality of first trenches and a plurality of second trenches at a first surface of a silicon substrate, wherein the plurality of second trenches are formed to a greater depth than the plurality of first trenches, forming a first conductive pad inside each of the plurality of first trenches and forming a second conductive pad inside each of the plurality of second trenches, forming a redistribution layer on the first surface of the silicon substrate, forming an external connection terminal on a first surface of the redistribution layer, removing the silicon substrate to expose each first conductive pad and each second conductive pad, mounting a first semiconductor chip to be connected to the first conductive pads, and forming an encapsulant to surround at least one surface of the first semiconductor chip.

According to example embodiments, which may include the aforementioned embodiments, a method of manufacturing a semiconductor package includes forming a plurality of trenches at a first surface of a silicon substrate, forming a conductive pad inside each of the plurality of trenches, forming a package substrate in the form of a redistribution layer on the first surface of the silicon substrate, the package substrate connected at a first surface to the conductive pad, forming an external connection terminal on a second surface of the package substrate opposite the first surface of the package substrate, removing the silicon substrate to expose the conductive pads, mounting a semiconductor chip to be connected to the conductive pads, and forming an encapsulant to surround at least one surface of the semiconductor chip.

BRIEF DESCRIPTION OF THE DRAWINGS

FIGS. 24 to 25 are cross-sectional views illustrating operations of a method of manufacturing a semiconductor package according to an example embodiment of the inventive concept.

DETAILED DESCRIPTION

Figure 1:
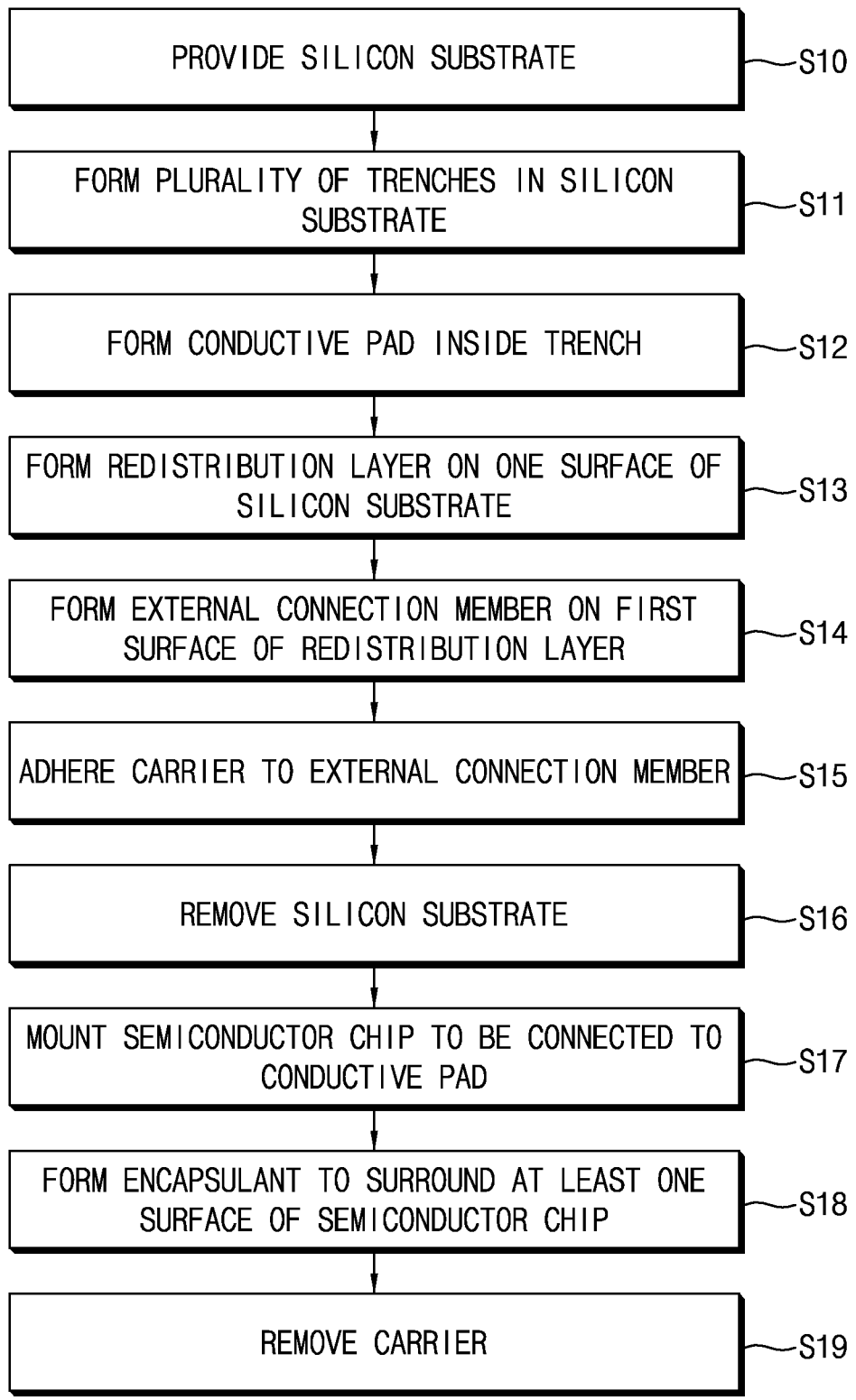
FIG. 1 is a flowchart of a method of manufacturing a semiconductor package according to an example embodiment of the inventive concept.

FIG. 1 is a flowchart of a method of manufacturing a semiconductor package according to an example embodiment of the inventive concept.

Referring to FIG. 1, the method of manufacturing the semiconductor package may include providing a silicon substrate (S10), forming a plurality of trenches in the silicon substrate (S11), forming a conductive pad inside each of the trenches (S12), forming a redistribution layer on one surface of the silicon substrate (S13), forming an external connection member on a first surface of the redistribution layer (S14), adhering a carrier to the external connection member (S15), removing the silicon substrate to expose the conductive pad (S16), mounting a semiconductor chip to be connected to the conductive pad (S17), forming an encapsulant to surround at least one surface of the semiconductor chip (S18), and removing the carrier (S19). As described herein, pads are formed of conductive material for transferring electrical signals between a first component (e.g., a package substrate, as described in greater detail below) and a second component (e.g., a semiconductor chip) to which the first component is connected. The pads may have a substantially flat external surface and may have a width greater than their height.

Hereinafter, the method of manufacturing the semiconductor package according to the example embodiment of the inventive concept as described above will be described with reference to FIGS. 2 to 12.

Figure 2:
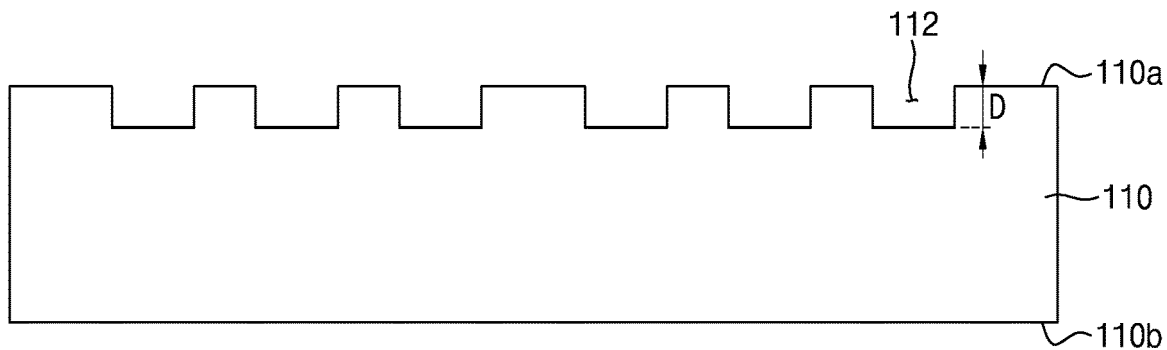
FIGS. 2 to 11 are cross-sectional views sequentially illustrating operations of a method of manufacturing a semiconductor package according to an example embodiment.

Referring to FIG. 2, the operation S10 of providing a silicon substrate 110 and the operation S11 of forming a plurality of trenches in the silicon substrate 110 are performed. The silicon substrate 110, generally referred to as a semiconductor substrate, has a first surface 110a, or first side, and a second surface 110b, or second side, that is a reverse side of the first surface 110a. The trench 112 may be formed at the first surface 110a of the silicon substrate 110. The plurality of trenches 112 may be formed and disposed a predetermined distance apart from each other. For example, the plurality of trenches 112 may be spaced apart from each other by a distance of 0.5 µm to 100 µm. In this manner, after operation S11, the first surface 110a of the substrate may have a shape that includes a plurality of trenches below an outer-most surface of the first side of the silicon substrate 110.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The plurality of trenches 112 may be formed, for example, by etching the silicon substrate 110, and the etching process may include, for example, a lithography process, a laser drilling process, a reactive ion etching (RIE) process, or a wet etching process. The plurality of trenches 112 may be formed to extend depth-wise in a vertical direction perpendicular to the first surface 110a of the silicon substrate 110 and have a depth D, for example, of 50 nm to 300 nm. In an example embodiment, the plurality of trenches 112 may be formed to have the same depth. In another example embodiment, some of the plurality of trenches 112 may have a different depth as others of the plurality of trenches 112. In an example embodiment, the plurality of trenches 112 may be formed to have the same width as each other in a particular horizontal direction. In another example embodiment, some of the plurality of trenches 112 may have a different width from others of the plurality of trenches 112.

Figure 3:
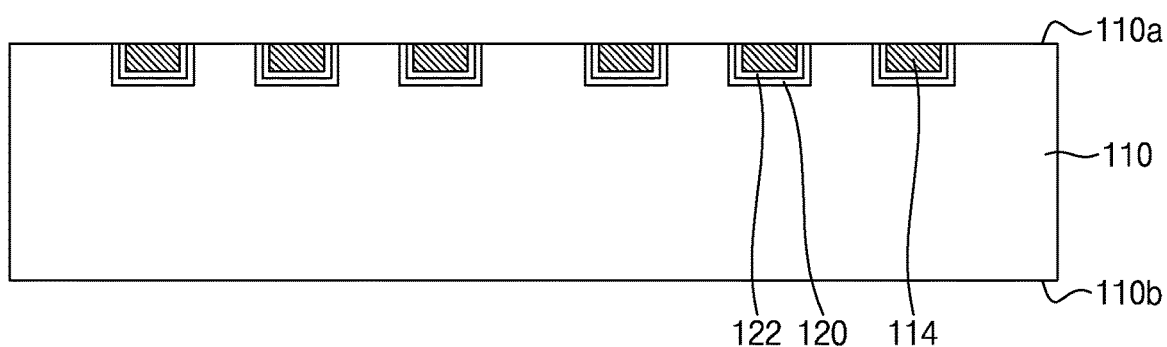

Referring to FIG. 3, the operation S12 of forming the conductive pad 114 inside the trench 112 is performed. A first barrier layer 120 and a first seed layer 122 may be further formed between the conductive pad 114 and an inner wall of the trench 112. The first barrier layer 120 may be disposed on inner walls of the plurality of trenches 112. The first seed layer 122 may be disposed on the first barrier layer 120, and the conductive pad 114 may be disposed on the first seed layer 122.

The first barrier layer 120 may include at least one selected from tantalum (Ta), titanium (Ti), tungsten (W), ruthenium (Ru), vanadium (V), cobalt (Co), and niobium (Nb). For example, the first barrier layer 120 may be formed of tantalum nitride, tantalum silicide, tantalum carbide, titanium nitride, titanium silicide, titanium carbide, tungsten nitride, tungsten silicide, tungsten carbide, ruthenium, ruthenium oxide, vanadium oxide, cobalt oxide, or niobium oxide. In an example embodiment, the first barrier layer 120 may include a plurality of layers. The first seed layer 122 may include at least one selected from aluminum (Al), titanium (Ti), chromium (Cr), iron (Fe), cobalt (Co), nickel (Ni), copper (Cu), zinc (Zn), palladium (Pd), platinum (Pt), gold (Au), and silver (Ag). The first barrier layer 120 and the first seed layer 122 may be deposited on the first surface 110a of the silicon substrate 110 by using a physical vapor deposition (PVD) process, a chemical vapor deposition (CVD) process, or an atomic layer deposition (ALD) process.

The conductive pad 114 may be formed by plating the first seed layer 122 with a conductive material. The plating process may include, for example, an electro-chemical plating (ECP) process or another type of plating process. The conductive pad 114 may include a metal such as Al, Ti, Cr, Fe, Co, Ni, Cu, Zn, Pd, Pt, Au, and Ag. In an example embodiment, the conductive pad 114 may include copper. Since the conductive pad 114 is disposed inside the trench 112 formed by etching the silicon substrate 110, the conductive pads 114 may be disposed at fine intervals.

The first barrier layer 120, the first seed layer 122, and the conductive pad 114 may be formed on the first surface 110a of the silicon substrate 110. After the operation S11 of forming the conductive pad 114 inside the trench 112, the first barrier layer 120, the first seed layer 122, and the conductive pad 114 may be planarized by using a chemical mechanical polishing (CMP) process. Upper ends of the conductive pad 114, the first barrier layer 120, and the first seed layer 122 may be at the same level (e.g., same vertical level) as the first surface 110a of the silicon substrate 110 by using the CMP process, and therefore may be coplanar with the first surface 110a of the silicon substrate 110.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 4:
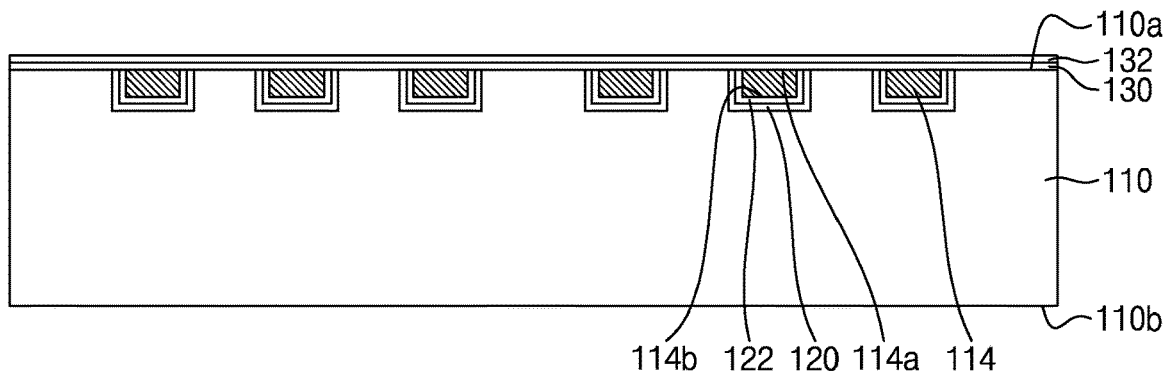

Referring to FIG. 4, a second barrier layer 130 and a second seed layer 132 are disposed on a first surface 114a of the conductive pad 114. Here, the first surface 114a of the conductive pad 114 may refer to a top surface of the conductive pad 114 shown in FIG. 4 and the top surface in contact with the second barrier layer 130. A second surface 114b of the conductive pad 114 may refer to a bottom surface of the conductive pad 114, which is located opposite to the first surface 114a of the conductive pad 114. The term "contact" or "in contact with" as used herein refers to a direct connection, e.g., touching.

The second barrier layer 130 may include at least one selected from Ta, Ti, W, Ru, V, Co, and Nb. In an example embodiment, the second barrier layer 130 may include a plurality of layers. The second seed layer 132 may be disposed on the second barrier layer 130. The second seed layer 132 may include at least one selected from Al, Ti, Cr, Fe, Co, Ni, Cu, Zn, Pd, Pt, Au, and Ag. The second barrier layer 130 and the second seed layer 132 may be deposited on the first surface 110a of the silicon substrate 110 by using a PVD process, a CVD process, an ALD process, or the like.

Figure 5:
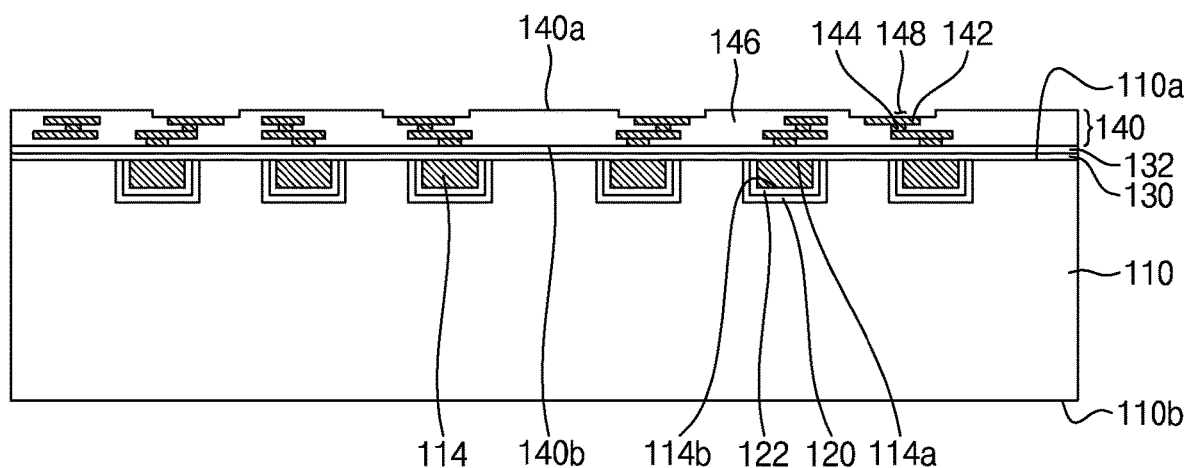

Referring to FIG. 5, an operation S13 of forming a redistribution layer 140 on the first surface 110a of the silicon substrate 110 may be performed. For example, the redistribution layer 140 may be formed on the second seed layer 132 disposed on the conductive pad 114. The redistribution layer 140 may have a first surface 140a and a second surface 140b that is a reverse side of (e.g., opposite) the first surface 140a. The first surface 140a of the redistribution layer 140 may refer to a top surface of the redistribution layer 140 shown in FIG. 5. The second surface 140b of the redistribution layer 140 may refer to a bottom surface of the redistribution layer 140 shown in FIG. 5 and the bottom surface that is in contact with the second seed layer 132. Spatially relative terms, such as "beneath," "below," "lower," "above," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The redistribution layer 140 may include interconnection patterns 142, vias 144, and insulating layers 146. The redistribution layer 140 may be formed by stacking the interconnection pattern 142 including a plurality of layers and the insulating layer 146. For example, after the insulating layer 146 is formed on the second seed layer 132, the insulating layer 146 may be partially etched to form an opening 148, and the interconnection pattern 142 and the via 144 may be formed in the opening 148. The insulating layer 146 may be formed again to cover the interconnection pattern 142 and the via 144. The interconnection pattern 142 may be exposed by the opening 148 formed in a top surface of the insulating layer 146. Although not shown, an under-bump metal (UBM) may be formed on the exposed interconnection pattern 142.

The interconnection pattern 142 may be disposed at several layers in the redistribution layer 140 and provide signal transmission paths. The via 144 may electrically connect the interconnection patterns 142 disposed at different layers. The via 144 may include a conductive material and be completely filled with the conductive material. The via 144 may be disposed along a wall surface of a via hole. The via 144 may have not only a taper shape but also a cylindrical shape. The via 144 may be integrally disposed with the interconnection pattern 142 of the redistribution layer 140. The interconnection pattern 142 and the via 144 may provide various signal paths in the semiconductor package. The insulating layer 146 may electrically insulate the interconnection pattern 142 and the via 144 from the outside.

The interconnection pattern 142 and the via 144 may include a conductive material such as copper (Cu), aluminum (Al), silver (Ag), tin (Sn), gold (Au), nickel (Ni), lead (Pb), titanium (Ti), or an alloy thereof. The insulating layer 146 may include any one selected from $SiO_2$, $Si_3N_4$, SiON, $Ta_2O_5$, $HfO_2$, polyimide (PI), polybenzoxazole (PBO), benzocyclobutene (BCB), bismaleimide triazine (BT), and a photosensitive resin. In some embodiments, the conductive pad 114, the second seed layer 132, and the interconnection pattern 142 may include the same metal and be electrically connected to each other. For example, the conductive pad 114, the second seed layer 132, and the interconnection pattern 142 may include copper. The redistribution layer, including insulation layers 146, interconnection patterns 142, and vias 144 may be formed in multiple repeated steps of forming a sub-insulating layer, forming openings in the sub-insulating layer, filling in the openings with a conductive material to form vias and/or interconnection patterns, and planarizing.

Figure 6:
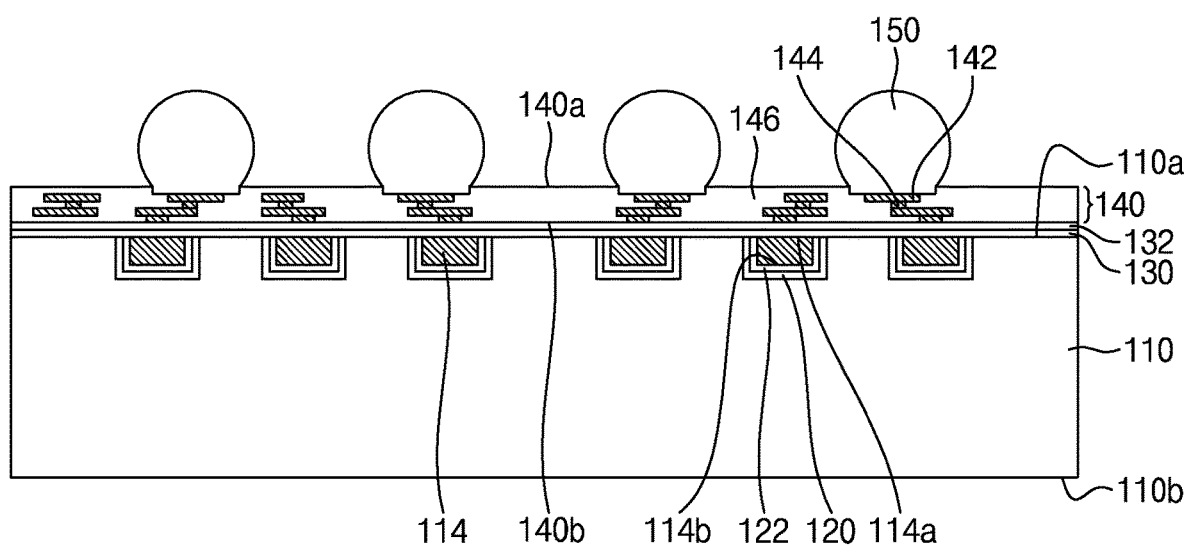

Referring to FIG. 6, the operation S14 of forming an external connection member 150 on the first surface 140a of the redistribution layer 140 is performed. The external connection member 150 may be electrically connected to the interconnection pattern 142 of the redistribution layer 140. For example, the external connection member 150 may be an external terminal electrically connected to the interconnection pattern 142 exposed by the opening 148 and disposed on the (optional) UBM disposed on the interconnection pattern 142. The redistribution layer 140 may be electrically connected to the outside of a semiconductor device (e.g., outside of a semiconductor package completed later in the process of FIGS. 2-11) through the external connection member 150. The external connection member 150 may be, for example, a solder ball or a C4 bump.

Figure 7:
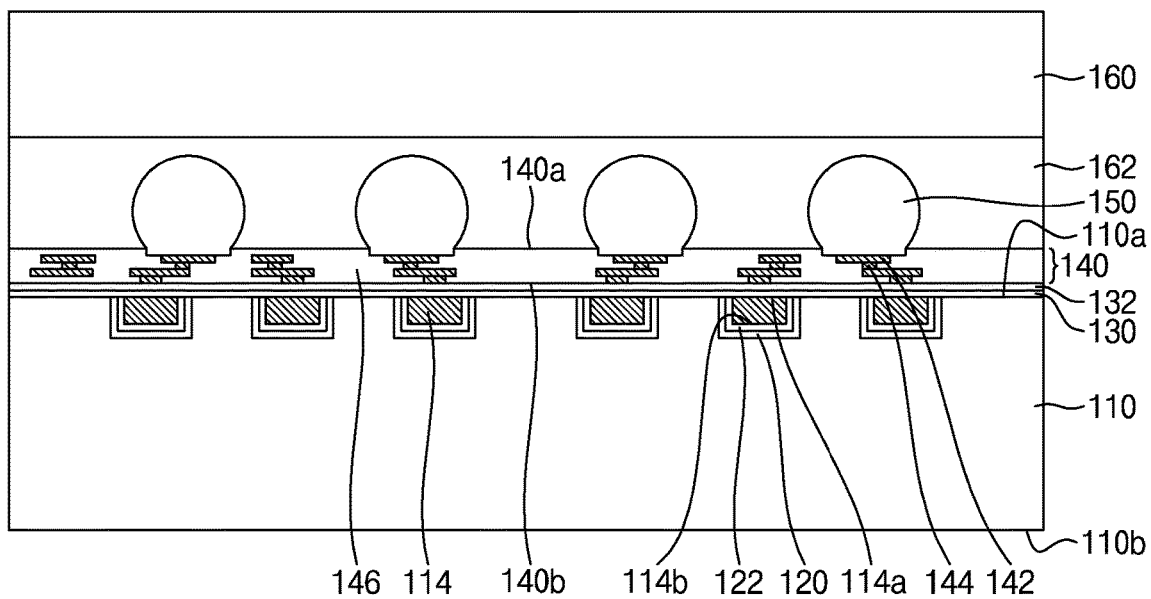

Referring to FIG. 7, the operation S15 of adhering a carrier 160 to the external connection member 150 is performed. The carrier 160 may be formed on the external connection member 150, for example by using an adhesive 162. The carrier 160 may protect the redistribution layer 140 and the external connection member 150 from an external impact or warpage during the manufacturing of the semiconductor package. The adhesive 162 may fix the carrier 160 to the external connection member 150. In some embodiments, the adhesive 162 may be formed to have a thickness greater than a diameter of the external connection member 150.

The carrier 160 may include silicon, germanium, silicon-germanium, gallium arsenide (GaAs), glass, a plastic, a ceramic, or the like but is not limited thereto. The adhesive 162 may include an epoxy adhesive, an adhesive film, or an adhesive tape, but is not limited thereto.

Figure 8:
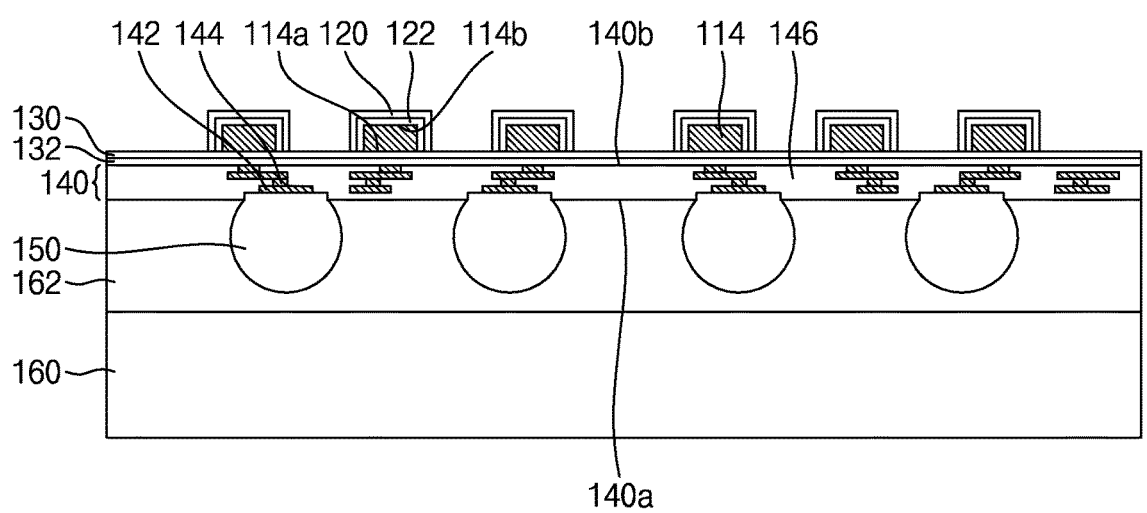

Referring to FIG. 8, the operation S16 of removing the silicon substrate 110 to expose the conductive pad 114 is performed. To remove the silicon substrate 110, a flipping process may be performed such that the second surface 110b of the silicon substrate 110 faces upward. In this manner, the device being manufactured may be flipped from a first orientation where the second surface 110b of the silicon substrate 110 faces downward to a second orientation where the second surface 110b of the silicon substrate 110 faces upward. The second surface 110b of the silicon substrate 110 may be partially removed using a back grinding process. For example, an upper end of the silicon substrate 110, which is etched by using a back grinding process, may be at the same level as an upper end of the conductive pad 114 or the first barrier layer 120. In one embodiment, the conductive pad 114 is not removed but remains after the back grinding process. The first barrier layer 120 and the first seed layer 122 disposed on the second surface 114b of the conductive pad 114 may not be removed. In an example embodiment, the first barrier layer 120 and the first seed layer 122 may be partially removed. Also, in some embodiments, a portion of the back-ground silicon substrate 110 may not be removed but may remain between the conductive pads 114. In that case, the silicon substrate 110 remaining between the conductive pads 114 may be removed using a dry etching process. In the operation S16 of removing the silicon substrate 110, the first barrier layer 120 and the first seed layer 122 may serve as protection so as to not remove the conductive pad 114. The second barrier layer 130 and the second seed layer 132 may protect the redistribution layer 140 so as to not remove the redistribution layer 140. Because the silicon substrate 110 is removed from the end product, it may be referred to as a sacrificial substrate, or a temporary or dummy substrate.

Figure 9:
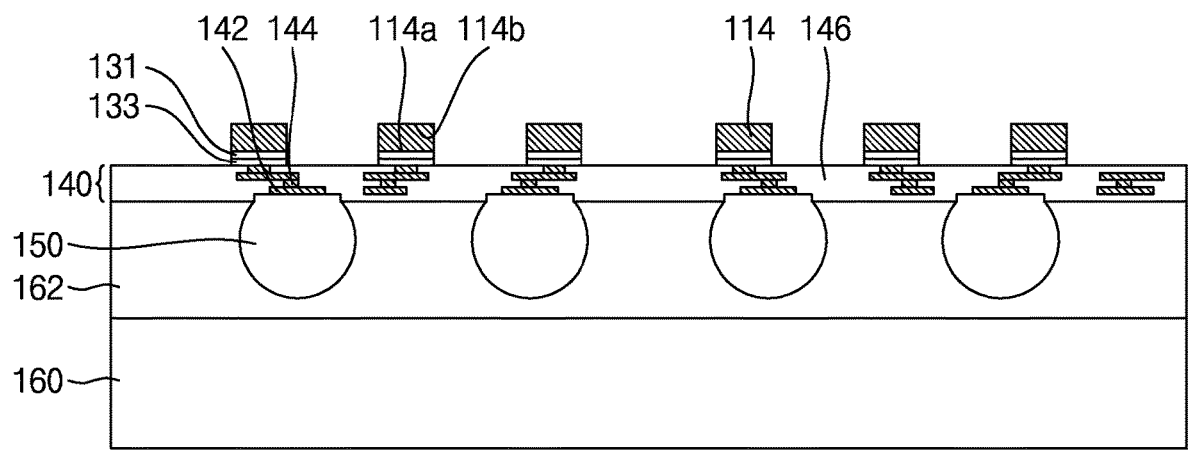

Referring to FIG. 9, the first barrier layer 120 and the first seed layer 122, which cover the second surface 114b and a side surface of the conductive pad 114, may be removed. The first barrier layer 120 and the first seed layer 122 may be removed to expose the conductive pad 114 so that a semiconductor chip may be mounted thereon. The second barrier layer 130 and the second seed layer 132 may be removed to prevent the conductive pads 114 from being electrically connected to each other through the second barrier layer 130 or the second seed layer 132. In some embodiments, portions of the second barrier layer 130 and the second seed layer 132 disposed on the second surface 140b of the redistribution layer 140 may not be removed. For example, the second barrier layer 131 and the second seed layer 133 may remain between the first surface 114a of the conductive pad 114 and the second surface 140b of the redistribution layer 140. The second barrier layer 131 may be disposed on the second seed layer 133.

Figure 10:
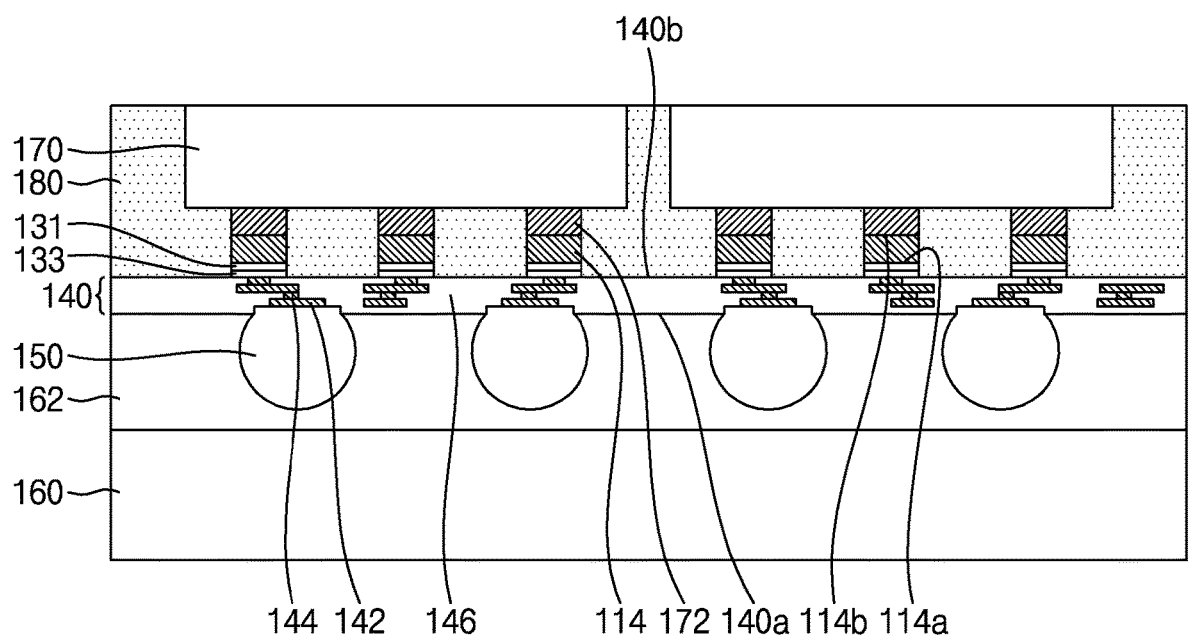

Referring to FIG. 10, the operation S17 of mounting a semiconductor chip 170 and the operation S18 of forming an encapsulant to surround at least one surface of the semiconductor chip 170 are performed. At least one semiconductor chip 170 (e.g., one chip or a plurality of stacked chips) may be mounted on the second surface 140b of the redistribution layer 140. The semiconductor chip 170 may include an inner connection member 172 disposed on a bottom surface thereof, and the inner connection member 172 may align with and may be adhered to the conductive pad 114. The inner connection member 172 may include, for example, copper or solder, and may be in the form of a pad, or pillar, for example. For example, a heating process may be used to cause the inner connection members 172, also described as chip terminals, to adhere to the conductive pads 114.

An encapsulant 180 may be formed between the second surface 140b of the redistribution layer 140 and the semiconductor chips 170. The encapsulant 180 may protect the semiconductor chips 170 so as to not damage the semiconductor chips 170. In an example embodiment, the encapsulant 180 may be formed on the semiconductor chip 170 (e.g., on a top surface of the semiconductor chip 170), and then an upper portion of the encapsulant 180 may be partially etched using a planarization process. An upper end of the encapsulant 180 may be at the same level as (e.g., coplanar with) an upper end (e.g., upper surface) of the semiconductor chip 170, and in some embodiments, the encapsulant 180 may cover and contact side surfaces, as well as a bottom surface of the semiconductor chip. In addition, though not shown, part of the encapsulant 180 may remain on the top surface of the semiconductor chip 170.

The encapsulant 180 may be a resin including epoxy, PI, or the like. For example, the encapsulant 180 may be, a bisphenol-group epoxy resin, a polycyclic aromatic epoxy resin, an o-cresol novolac epoxy resin, a biphenyl-group epoxy resin, a naphthalene-group epoxy resin, or the like.

Figure 11:
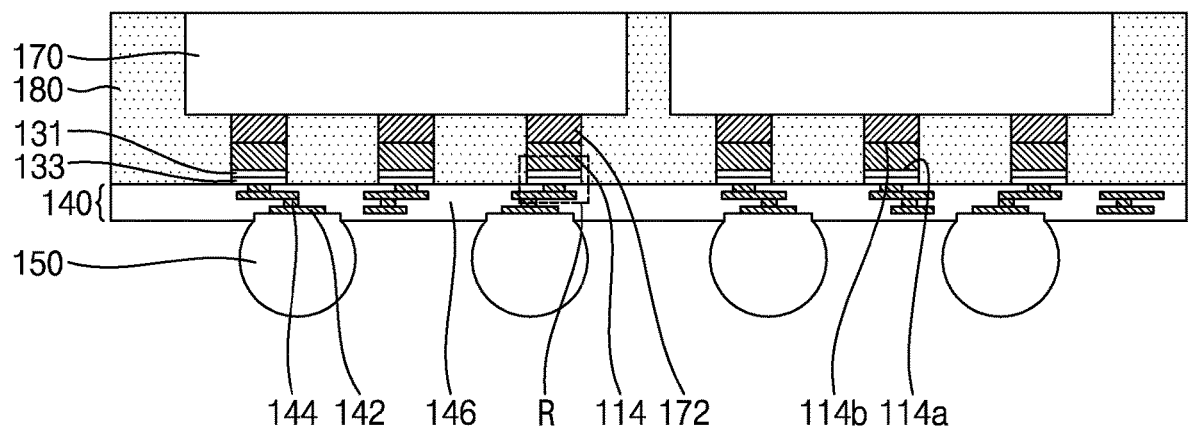

Referring to FIG. 11, the operation S19 of removing the carrier 160 is performed. For example, the adhesive 162 adhered to the redistribution layer 140 and the external connection member 150 may be debonded therefrom to thus remove the carrier 160. A semiconductor package 100 may thereafter be diced and completed. The completed semiconductor package 100 may be mounted on the silicon substrate 110 (e.g., a module board of a memory module) and electrically connected to the silicon substrate 110 through the external connection member 150. Another package or component may be further mounted on the semiconductor package 100 according to example embodiments. The semiconductor package 100 described herein may be a memory device (including one or more memory chips), or a logic device (including one or more logic chips). As can be seen from the above description, a semiconductor package includes a package substrate, which in the above description is in the form of a redistribution layer, one or more semiconductor chips mounted on the package substrate, and an encapsulant formed to cover the one or more semiconductor chips and the package substrate.

As shown in FIGS. 3 to 11, the conductive pad 114 connected to the semiconductor chip 170 may be formed and disposed before the redistribution layer 140 is formed. Thus, the operations S12, S13, and S14 of forming the conductive pad 114, the redistribution layer 140, and the external connection member 150 may be performed as a series of processes. The method of manufacturing the semiconductor package according to this and other embodiments may be performed without using a through substrate via such as a through-silicon via (TSV) that passes through an entire substrate, for example using a drilling process. Therefore, the above and other embodiments may provide a simple process by using a wafer support system (WSS) only once. Since the conductive pad 114 is disposed inside the trench 112 formed by etching the silicon substrate 110, the conductive pads 114 may be formed at fine intervals.

Figure 12:
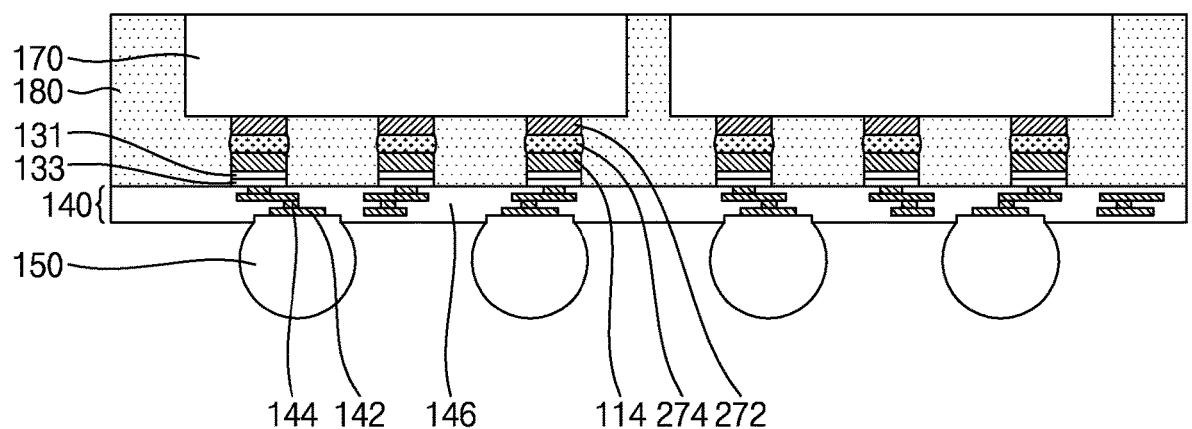
FIG. 12 is a cross-sectional view of a semiconductor package according to an example embodiment of the inventive concept.

FIG. 12 is a cross-sectional view of a semiconductor package 200 (which may include two semiconductor packages to be separated from each other) according to an example embodiment of the inventive concept.

Referring to FIG. 12, a solder cap 274 may be further disposed on a top surface of a conductive pad 114. Here, the top surface of the conductive pad 114 may refer to a second surface 114b of the conductive pad 114. The solder cap 274 may facilitate the connection of the conductive pad 114 with the inner connection member 272. The solder cap 274 may be prepared and disposed on the top surface of the conductive pad 114 before the semiconductor chip 170 is mounted. A heating process may be used to connect the inner connection member 272 to the conductive pad 114 through the solder cap 274.

Figure 13:
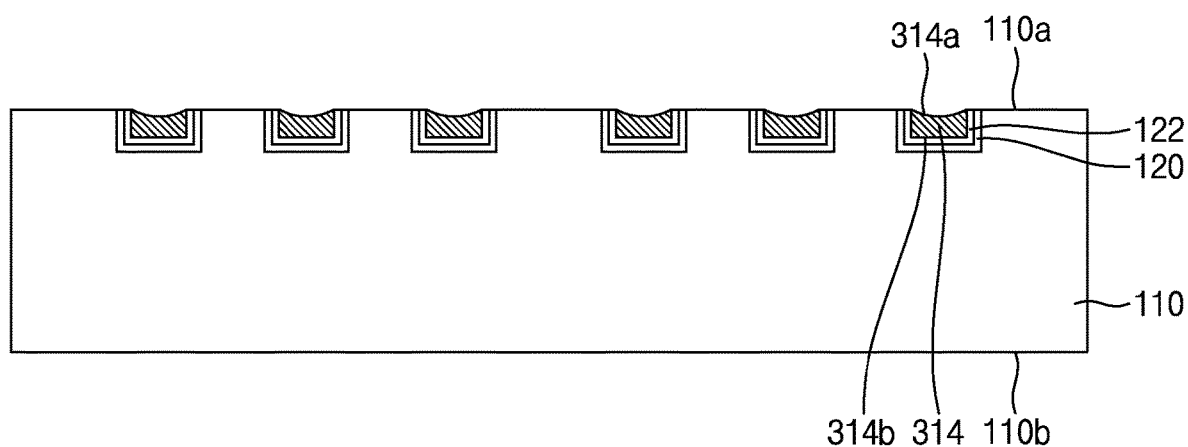
FIGS. 13 and 14 are cross-sectional views illustrating conductive pads according to example embodiments of the inventive concept.
Figure 14:
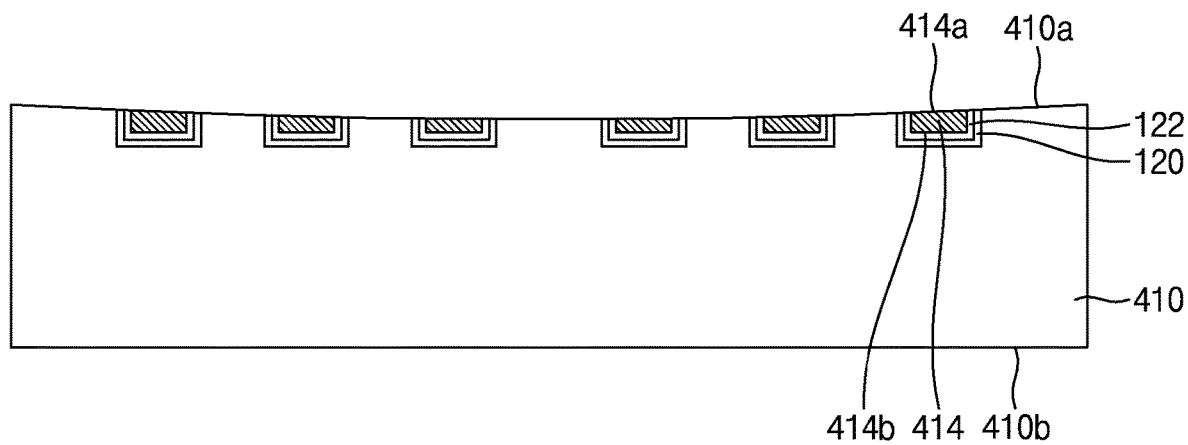

FIGS. 13 and 14 are cross-sectional views illustrating conductive pads according to example embodiments of the inventive concept. As described above, an operation of forming a conductive pad inside a trench may include forming a conductive material on a first seed layer and performing a CMP process. Although the CMP process is used to planarize a surface of a material, the surface of the material may be excessively polished to cause phenomena such as dishing, erosion, or the like.

FIG. 13 illustrates a case in which dishing occurs after a CMP process. As shown in FIG. 13, a conductive pad 314 may be excessively polished, and a first surface 314a of the conductive pad 314 may be formed at a lower level than a first surface 110a of a silicon substrate 110. For example, the first surface 314a of the conductive pad 314 may be concavely formed toward a second surface 314b thereof. Although FIG. 13 illustrates a case in which a first barrier layer 120 and a first seed layer 122 are not excessively polished, the inventive concept is not limited thereto.

FIG. 14 illustrates a case in which erosion occurs after a CMP process. As shown in FIG. 14, a silicon substrate 410 and a conductive pad 414 may be excessively polished. A first surface 410a of the silicon substrate 410 may be concavely formed toward a second surface 410b thereof, and a first surface 414a of the conductive pad 414 may be concavely formed toward a second surface 414b thereof.

Figure 15A:
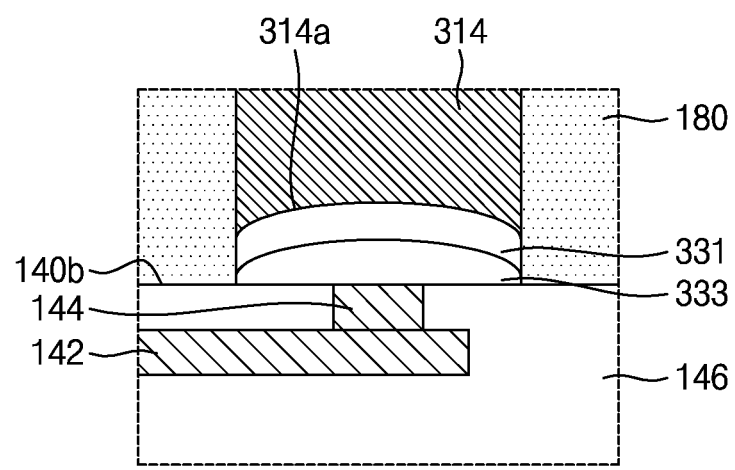
FIGS. 15A and 15B are partial enlarged views of a semiconductor package according to example embodiments of the inventive concept.
Figure 15B:
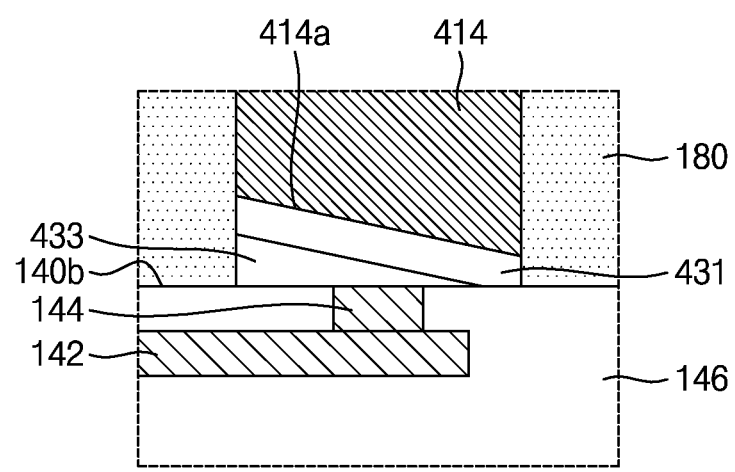

FIGS. 15A and 15B are partial enlarged views of a semiconductor package according to example embodiments of the inventive concept.

FIG. 15A is a partial enlarged view of a semiconductor package 400 that is manufactured by performing the manufacturing method shown in FIGS. 4 to 11 using the conductive pad 314 shown in FIG. 13. FIG. 15A may correspond to a region R of a semiconductor package 100 according to a modified embodiment of FIG. 11. Referring to FIG. 15A, a first surface 314a of a conductive pad 314 may be disposed at a higher level than a second surface 140b of a redistribution layer 140. In one embodiment, the first surface 314a of the conductive pad 314 may be concavely formed with respect to a second surface 140b of the redistribution layer 140. A second barrier layer 331 may be convexly disposed along the first surface 314a of the conductive pad 314. A second seed layer 333 may be formed under the second barrier layer 331 along a surface of the second barrier layer 331, and a bottom surface of the second seed layer 333 may be disposed at the same level as the second surface 140b of the redistribution layer 140.

FIG. 15B is a partial enlarged view of a semiconductor package 400 that is manufactured by performing the manufacturing method shown in FIGS. 4 to 11 using the conductive pad 414 shown in FIG. 14. FIG. 15B may correspond to a region R of a semiconductor package 100 according to a modified embodiment of FIG. 11. Referring to FIG. 15B, a first surface 414a of the conductive pad 414 may be disposed at a higher level than a second surface 140b of a redistribution layer 140. For example, the first surface 414a of the conductive pad 414 may have an inclined shape with respect to the second surface 140b of the redistribution layer 140, and a lower end of the first surface 414a of the conductive pad 414 may be at a higher level than the second surface 140b of the redistribution layer 140. A second barrier layer 431 may be inclined along the first surface 414a of the conductive pad 414. A second seed layer 433 may be formed under the second barrier layer 431 along a surface of the second barrier layer 431, and a bottom surface of the second seed layer 433, and in some embodiments, a bottom surface of the second barrier layer 431, may be at the same level as the second surface 140b of the redistribution layer 140.

Figure 16:
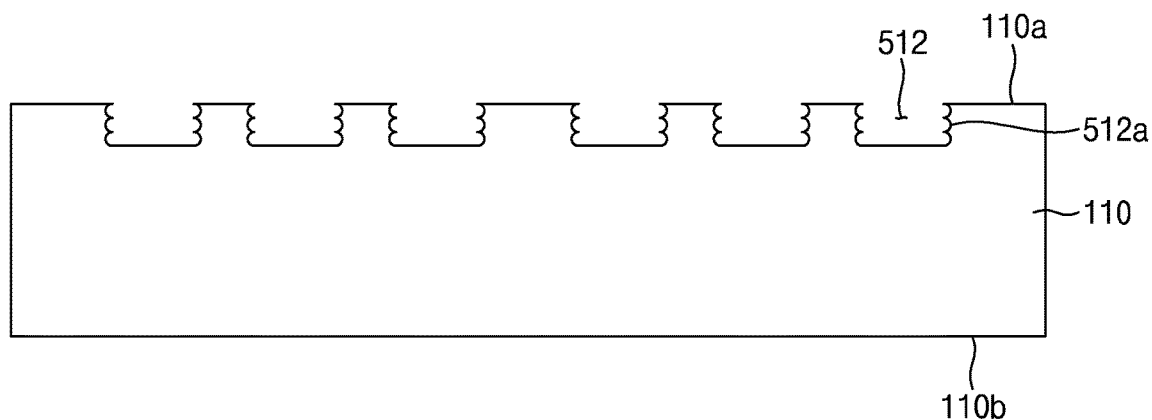
FIG. 16 is a cross-sectional view illustrating a trench of a semiconductor package according to an example embodiment of the inventive concept.
Figure 17:
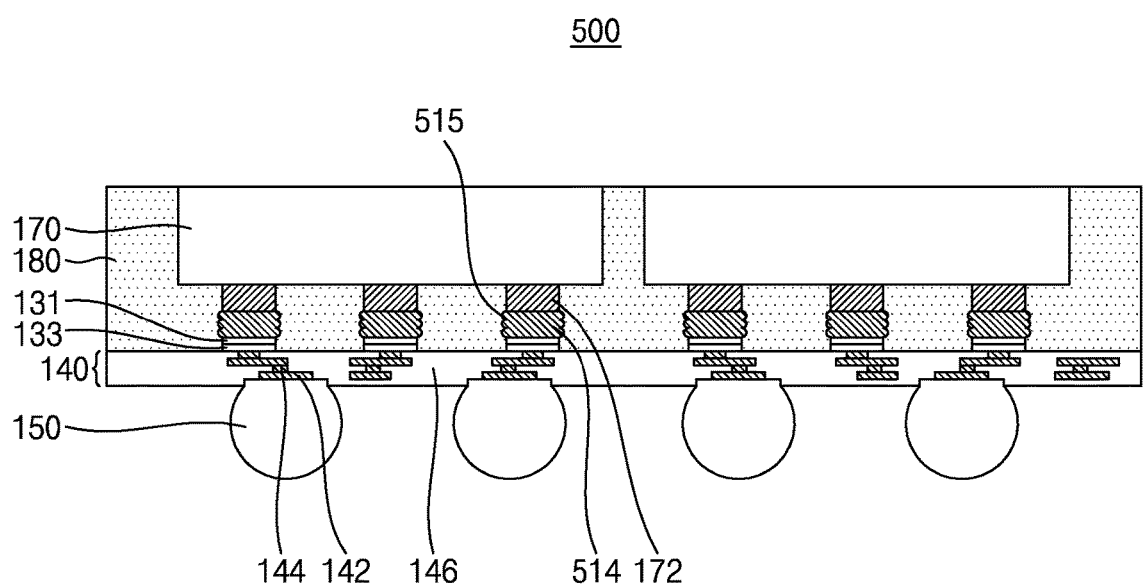
FIG. 17 is a cross-sectional view of a semiconductor package according to an example embodiment of the inventive concept.

FIG. 16 is a cross-sectional view illustrating a trench of a semiconductor package 500 according to an example embodiment of the inventive concept. FIG. 17 is a cross-sectional view of the semiconductor package 500 (which may include two semiconductor packages to be separated from each other) according to an example embodiment of the inventive concept.

Referring to FIG. 16, a side surface 512a of a trench 512 may have a scallop shape. The trench 512 may be formed by etching a silicon substrate 110, and the etching process may be performed using a Bosch etching process. The Bosch etching process may include forming a first recess in the silicon substrate 110, depositing a protective film in the first recess, and etching the first recess in which the protective film is deposited and thus to form a second recess. The Bosch etching process may be repeated to form the trench 512. The protective film may be removed after the trench 512 is formed. The side surface 512a of the trench 512 formed by the Bosch etching process may have the scallop shape.

FIG. 17 illustrates a semiconductor package (which may include two semiconductor packages to be separated from each other) manufactured by performing the manufacturing method shown in FIGS. 3 to 11 on the trench 512 shown in FIG. 16. A side surface 515 of a conductive pad 514 formed inside the trench 512 may have a scallop shape.

Figure 18:
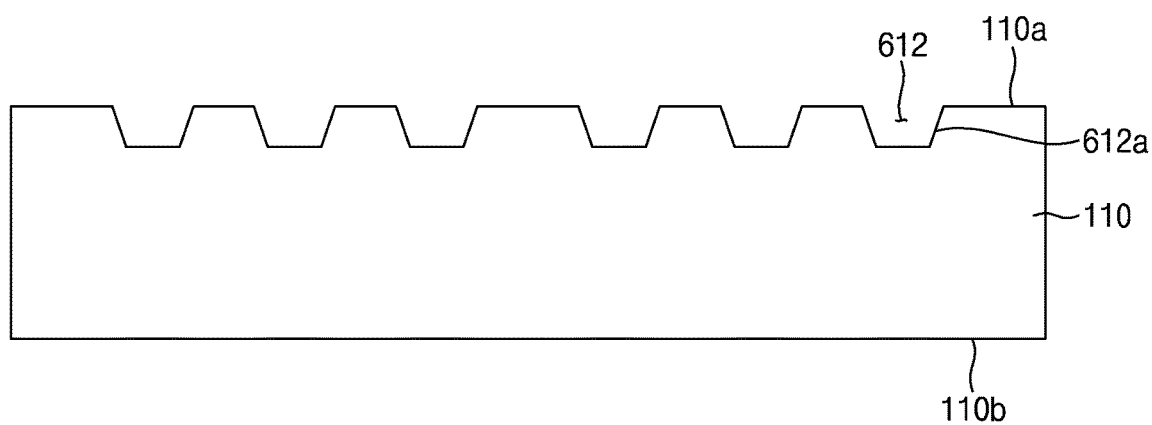
FIG. 18 is a cross-sectional view illustrating a trench of a semiconductor package according to an example embodiment of the inventive concept.
Figure 19:
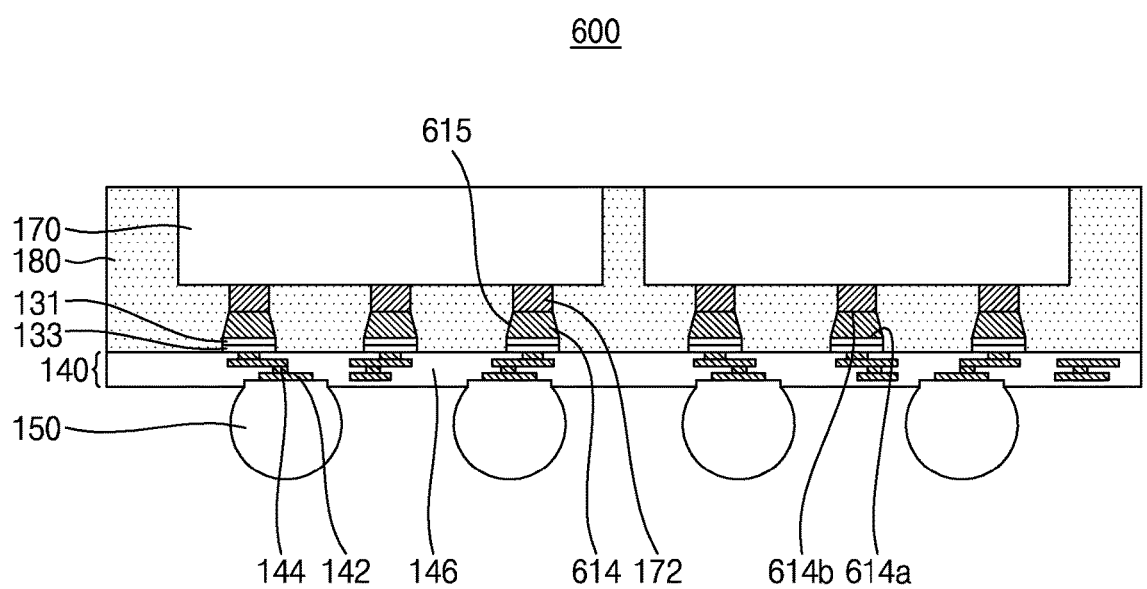
FIG. 19 is a cross-sectional view of a semiconductor package according to an example embodiment of the inventive concept.

FIG. 18 is a cross-sectional view illustrating a trench of a semiconductor package 600 according to an example embodiment of the inventive concept. FIG. 19 is a cross-sectional view of the semiconductor package 600 (which may include two semiconductor packages to be separated from each other) according to an example embodiment of the inventive concept.

Referring to FIG. 18, a side surface 612a of a trench 612 may have an inclined shape. For example, a width of the trench 612 may be reduced from a first surface 110a of a silicon substrate 110 toward a second surface 110b thereof.

FIG. 19 illustrates a semiconductor package (which may include two semiconductor packages to be separated from each other) manufactured by performing the method shown in FIGS. 3 to 11 on the trench 612 shown in FIG. 18. A conductive pad 614 formed inside the trench 612 shown in FIG. 18 may have a first surface 614a having a greater width than a second surface 614b thereof. Also, a side surface 615 of the conductive pad 614 may have an inclined shape.

Figure 20:
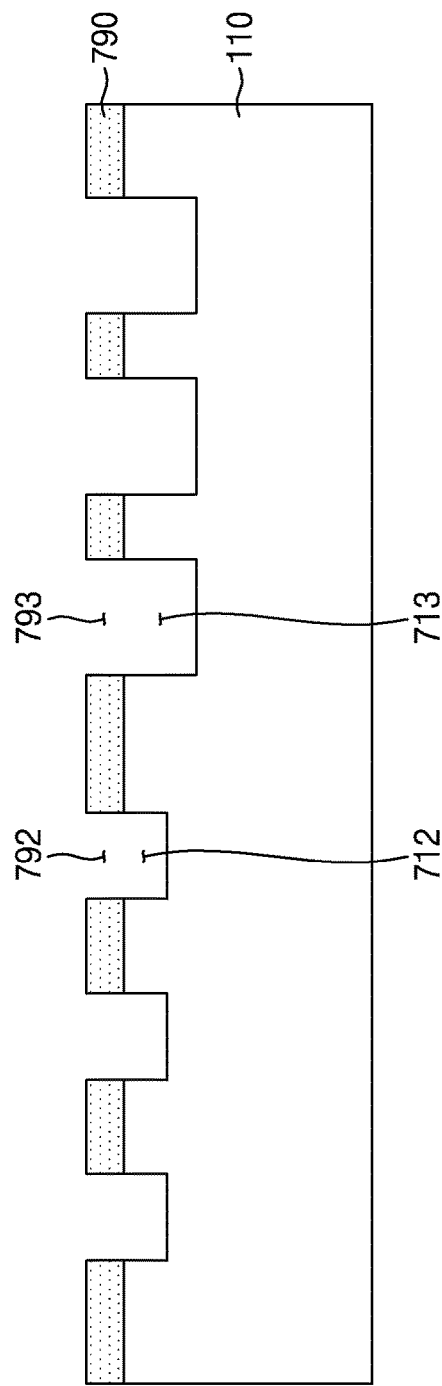
FIG. 20 is a cross-sectional view illustrating a trench of a semiconductor package according to an example embodiment of the inventive concept.
Figure 21:
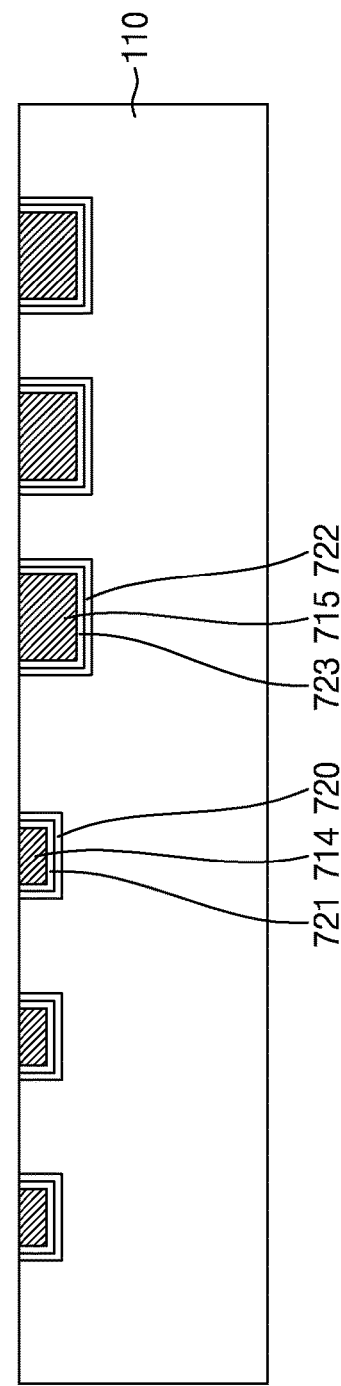
FIG. 21 is a cross-sectional view illustrating conductive pads according to an example embodiment of the inventive concept.
Figure 22:
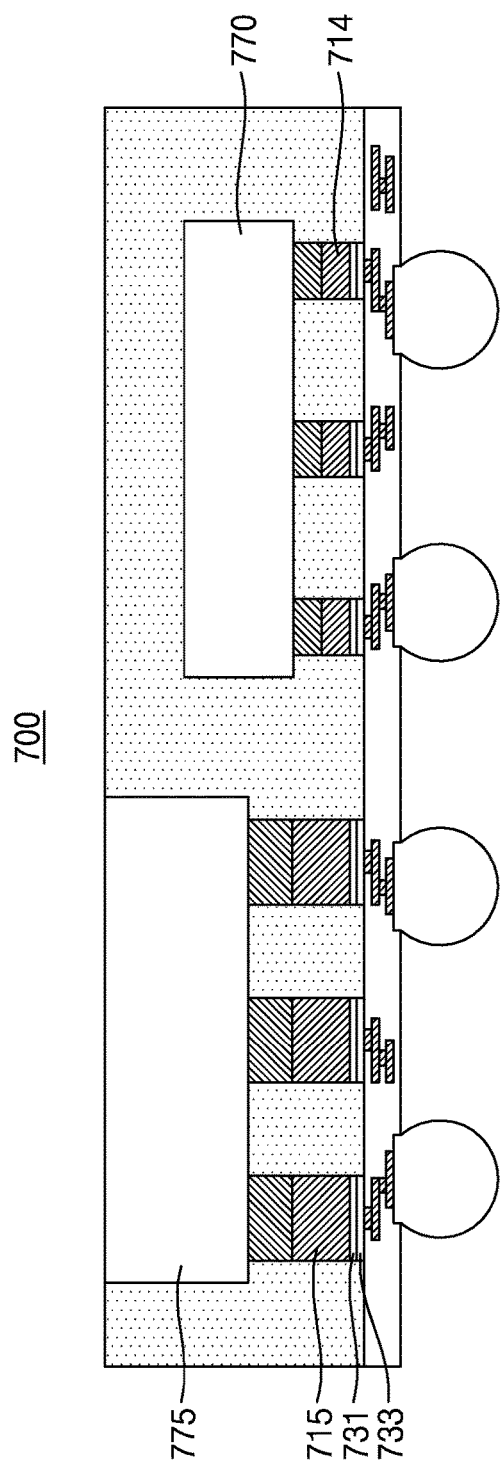
FIG. 22 is a cross-sectional view of a semiconductor package according to an example embodiment of the inventive concept.

FIG. 20 is a cross-sectional view illustrating a trench of a semiconductor package 700 according to an example embodiment of the inventive concept. FIG. 21 is a cross-sectional view of a conductive pad of the semiconductor package 700 according to an example embodiment of the inventive concept. FIG. 22 is a cross-sectional view of the semiconductor package 700 according to an example embodiment of the inventive concept.

In general, the operation of forming the trench may include a coating process of coating the entire silicon substrate with photoresist having a uniform thickness, a soft-baking process of thermally treating an undried photoresist solvent, an exposure process of transferring a photomask pattern to a surface of the silicon substrate, a developing process of removing a photoresist film from a portion to be etched, and a hard baking process of evaporating the remaining solvent to increase adhesion and film precision and facilitate subsequent processes including an etching process.

Referring to FIGS. 20 and 2, in the operation S11 of forming the plurality of trenches in the silicon substrate 110, trenches 712 and 713 having various heights may be formed. To begin with, a mask 790 having a first opening 792 and a second opening 793 may be disposed on a silicon substrate 110. The second opening 793 may be formed to have a width greater than a width of the first opening 792. The silicon substrate 110 covered with the mask 790 may be etched to a predetermined depth by using a deep reactive ion etching (DRIE) process. A first trench 712 may be formed in a portion of the silicon substrate 110 exposed by the first opening 792, while a second trench 713 may be formed in a portion of the silicon substrate 110 exposed by the second opening 793. The second trench 713 may have a greater width than the first trench 712. In an example embodiment, the second trench 713 may be formed to have a depth greater than a depth of the first trench 712.

Referring to FIG. 21, a first conductive pad 714 and a second conductive pad 715 may be disposed in the first trench 712 and the second trench 713, respectively. The first conductive pad 714 and the second conductive pad 715 may include the same material. For example, the first conductive pad 714 and the second conductive pad 715 may include copper. The second conductive pad 715 may have a greater width than the first conductive pad 714. In an example embodiment, a height (e.g., depth, or vertical length) of the second conductive pad 715 may be greater than a height (e.g., depth, or vertical length) of the first conductive pad 714 such that the first conductive pad 714 extends from a surface of the substrate 110 into the substrate to a first depth, and the second conductive pad 715 extends from a surface of the substrate 110 into the substrate to a second depth greater than the first depth. As described with reference to FIG. 3, a first barrier layer 720 may be disposed on an inner wall of the first trench 712, and a first seed layer 721 may be disposed on the first barrier layer 720. The first conductive pad 714 may be disposed on the first seed layer 721 inside the first trench 712. Similarly, a first barrier layer 722 may be disposed on the inner wall of the second trench 713, and a first seed layer 723 may be disposed on the first barrier layer 722. The second conductive pad 715 may be disposed on the first seed layer 723 inside the second trench 713.

FIG. 22 illustrates a semiconductor package 700 that is manufactured by using the method shown in FIGS. 4 to 11 after a first conductive pad 714 and a second conductive pad 715 are disposed. A first semiconductor chip 770 may be mounted on the first conductive pad 714, and a second semiconductor chip 775 may be mounted on the second conductive pad 715. For example, the first semiconductor chip 770 may include a memory device, such as dynamic random access memory (DRAM), static RAM (SRAM), a high-bandwidth memory (HBM), a hybrid memory cube (HMC), and the like, and the second semiconductor chip 775 may include a logic chip such as an application processor, a graphics processing unit (GPU), and the like. Different kinds of chips may be mounted on a single package in a System-in-Package (SiP). A second barrier layer 731 may be disposed under the second conductive pad 715, and a second seed layer 733 may be disposed under the second barrier layer 731.

As shown in FIGS. 20 and 21, the first conductive pad 714 and the second conductive pad 715 may be formed to have different sizes using one process by using a method of forming trenches in the silicon substrate 110. Thus, a package manufacturing process may be simplified.

Figure 23:
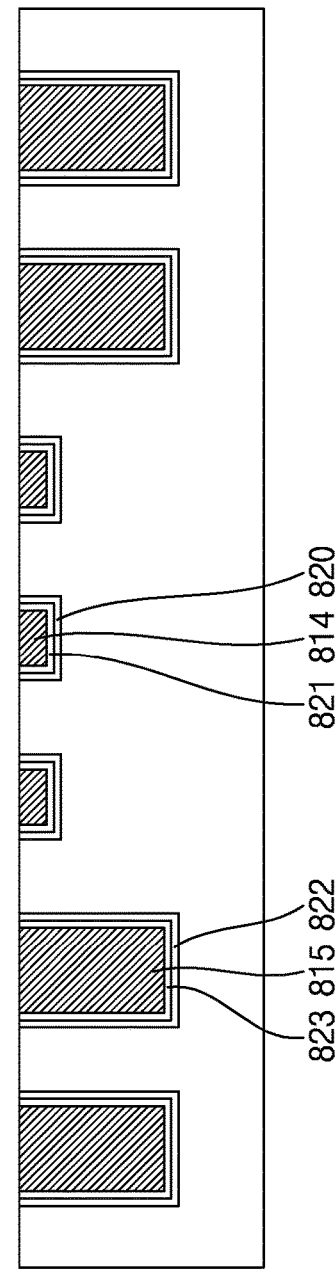
FIG. 23 is a cross-sectional view illustrating conductive pads and interconnectors according to an example embodiment of the inventive concept.

FIG. 23 is a cross-sectional view illustrating a conductive pad and an interconnector of a semiconductor package 800 according to an example embodiment of the inventive concept. FIGS. 24 and 25 are cross-sectional views illustrating a method of manufacturing the semiconductor package 800 according to an example embodiment of the inventive concept.

Referring to FIG. 23, trenches having different heights (e.g., depths) may be formed by using the method shown in FIG. 20. A conductive pad 814 and an interconnector 815 may be disposed inside each of the trenches. The conductive pad 814 and the interconnector 815 may include the same material. For example, the conductive pad 814 and the interconnector 815 may include copper. The interconnector 815 may be formed to have a width greater than a width of the conductive pad 814, and the interconnector 815 may be formed to have a height greater than a height of the conductive pad 814. In addition, the width of the conductive pad 814 may be greater than the height of the conductive pad 814, while the width of the interconnector 815 may be less than height of the interconnector 815. As shown in FIG. 3, a first barrier layer 820 may be disposed on an inner wall of the trench, and a first seed layer 821 may be disposed on the first barrier layer 820. The conductive pad 814 may be disposed on the first seed layer 821 inside the trench. Similarly, a first barrier layer 822 may be disposed on the inner wall of the trench, and a first seed layer 823 may be disposed on the first barrier layer 822. The interconnector 815 may be disposed on the first seed layer 823 inside the trench.

FIG. 24 illustrates a lower package 802 that is manufactured by using the method shown in FIGS. 4 to 11 after a conductive pad 814 and an interconnector 815 are disposed. The lower package 802 may include an interconnector 815, a redistribution layer 140, a semiconductor chip 870, and an encapsulant 180. An upper end of the interconnector 815 may be at substantially the same level as an encapsulant 180. In an example embodiment, a top surface of the interconnector 815 may be disposed at substantially the same level as a top surface of the semiconductor chip 870. For example, after the encapsulant 180 is formed to surround at least one surface of the interconnector 815 and at least one surface of the semiconductor chip 870, a planarization process may be performed to planarize the interconnector 815, the semiconductor chip 870, and the encapsulant 180. The upper end of the interconnector 815 may be exposed to the outside. In another example embodiment, the top surface of the interconnector 815 may be at a higher level than the top surface of the semiconductor chip 870. A second barrier layer 831 may be disposed under the interconnector 815, and a second seed layer 833 may be disposed under the second barrier layer 831.

FIG. 25 illustrates a semiconductor package 800 in which an upper package 804 is stacked on a lower package 802. The upper package 804 may include an upper substrate 840 (e.g., package substrate), an upper semiconductor chip 875, an upper connection member 874, and an encapsulant 876. The upper package 804 may implement a different function from that of the lower package 802. For example, the lower package 802 may perform a logic operation, and the upper package 804 may function as a memory device.

The upper substrate 840 may be formed as a printed circuit board (PCB), a silicon substrate, or a redistribution layer. The upper semiconductor chip 875 may perform a different type of operation from the semiconductor chip 870.

For example, the upper semiconductor chip 875 may be a memory chip, such as DRAM, SRAM, and the like, and the semiconductor chip 870 may be a logic chip such as an application processor. FIG. 25 illustrates a case in which the upper semiconductor chip 875 is wire-bonded to the upper substrate 840, but the inventive concept is not limited thereto. In an example embodiment, the upper semiconductor chip 875 may be mounted on the upper substrate 840 using a flip-chip process. The upper connection member 874, which may be described as a package interconnection terminal may be electrically connected to the interconnector 815. The upper semiconductor chip 875 may be electrically connected to the redistribution layer 140, the semiconductor chip 870, and the external connection member 150 through the interconnector 815. An encapsulant 876 may be formed to surround at least one surface of the upper substrate 840 and at least one surface the upper semiconductor chip 875 and protect the upper substrate 840 and the upper semiconductor chip 875 from an external impact. The encapsulant 876 may include the same material as the encapsulant 180 of the above-described lower package 802. The encapsulant 876 may be formed in advance before the upper package 804 is stacked on the lower package 802.

As shown in FIGS. 23 to 25, the conductive pad 814 and the interconnector 815 may be formed by using a series of processes of forming the trenches in the silicon substrate 110 and performing an electroplating process so that the entire process may be simplified. Since the trenches are formed by etching the silicon substrate 110, the conductive pads 814 and the interconnectors 815 may be arranged at fine intervals.

According to the example embodiments of the inventive concept, a conductive pad can be formed on a silicon substrate, and a redistribution layer and an external connection member can be sequentially formed on the conductive pad.

In the embodiments described above, when forming a semiconductor package, the external connection terminals for the package may be formed and attached to a package substrate, which is in the form of a redistribution layer, before a semiconductor chip is mounted on the package substrate. In addition, during the process of forming the package substrate and mounting the chip on the package substrate in this manner, according to certain embodiments, the device being manufactured only needs to be flipped one time (e.g., from a first orientation to a second flipped orientation) between the first step of providing an unprocessed substrate, and completion of the package. Therefore, a manufacturing process can be simplified.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A method of manufacturing a semiconductor package, the method comprising:
   forming a plurality of trenches at a first surface of a silicon substrate;
   subsequently forming a conductive pad inside each of the plurality of trenches, thereby forming a plurality of conductive pads;
   sequentially depositing a barrier layer and a seed layer on the first surface of the silicon substrate;
   subsequently forming a redistribution layer on the seed layer;
   subsequently forming an external connection terminal on a first surface of the redistribution layer, wherein the external connection terminal is a solder ball or a C4 bump;
   subsequently removing the silicon substrate and exposing each conductive pad;
   subsequently mounting a semiconductor chip on the conductive pads to connect the semiconductor chip to the conductive pads; and
   forming an encapsulant to cover at least one surface of the semiconductor chip,
   wherein a first surface of each conductive pad, which is a surface of the conductive pad facing away from the silicon substrate before the silicon substrate is removed, is concavely formed toward a second surface of the conductive pad, which is opposite to the first surface,
   wherein the barrier layer is in contact with the first surfaces of the conductive pads and the first surface of the silicon substrate, and the seed layer is between the barrier layer and the redistribution layer, and
   wherein a surface of the seed layer is planar and is at the same level as a second surface of the redistribution layer, which is opposite to the first surface of the redistribution layer.

2. The method of claim 1, wherein the barrier layer comprises titanium, and the seed layer comprises copper.

3. The method of claim 1, further comprising:
   after the removing of the silicon substrate, removing portions of the barrier layer and the seed layer, and at the same time removing another barrier layer and another seed layer to expose each conductive pad.

4. The method of claim 3, wherein the barrier layer and the seed layer disposed between each conductive pad and the redistribution layer are not removed.

5. The method of claim 1, further comprising forming a carrier on the redistribution layer and the external connection terminal.

6. The method of claim 1, wherein the forming of the conductive pads comprises planarizing an upper portion of the conductive pads.

7. The method of claim 1, further comprising, between the step of forming the external connection terminal and mounting the semiconductor chip to be connected to the conductive pads, flipping the device being manufactured.

8. The method of claim 7, wherein between initiating the step of forming the plurality of trenches at the first surface of the silicon substrate and completing the step of mounting the semiconductor chip to be connected to the conductive pads, the device being manufactured, which as a result of these steps includes the formed redistribution layer, the formed external connection terminal, and the mounted semiconductor chip, is flipped only one time.

9. The method of claim 1, including at least one of the following:
   the trenches are formed to have a depth of 50 nm to 300 nm; and
   a distance between the conductive pads ranges from 0.5 μm to 100 μm.

10. A method of manufacturing a semiconductor package, the method comprising:
    forming a plurality of first trenches and a plurality of second trenches at a first surface of a silicon substrate, the plurality of second trenches being formed to a greater depth than the plurality of first trenches;

subsequently forming a first conductive pad inside each of the plurality of first trenches and forming a second conductive pad inside each of the plurality of second trenches, thereby forming a plurality of first conductive pads and a plurality of second conductive pads;

sequentially depositing a barrier layer and a seed layer on the first surface of the silicon substrate;

subsequently forming a redistribution layer on the seed layer;

subsequently forming an external connection terminal on a first surface of the redistribution layer, the external connection terminal being a solder ball or C4 bump;

subsequently removing the silicon substrate and exposing each first conductive pad and each second conductive pad;

subsequently mounting a first semiconductor chip to be connected to the first conductive pads; and forming an encapsulant to surround at least one surface of the first semiconductor chip, wherein a first surface of each first and second conductive pad is concavely formed toward a second surface of each first and second conductive pad, respectively, which second surface is opposite to the first surface, wherein the barrier layer is in contact with the first surfaces of the first and second conductive pads and with the first surface of the silicon substrate, and the seed layer is between the barrier layer and the redistribution layer, and wherein a surface of the seed layer is planar and is at the same level as a second surface of the redistribution layer, which is opposite to the first surface of the redistribution layer.

11. The method of claim 10, further comprising mounting a second semiconductor chip to be connected to the second conductive pads after removing the silicon substrate and before forming the encapsulant to surround at least one surface of the first semiconductor chip.

12. The method of claim 11, wherein the second conductive pads have a higher vertical length than the first conductive pads.

13. The method of claim 10, wherein the second conductive pads are interconnectors, and a top surface of each interconnector is at the same vertical level as a top surface of the first semiconductor chip or at a higher vertical level than the top surface of the first semiconductor chip.

14. The method of claim 13, further comprising stacking an upper package on the first semiconductor chip, wherein the upper package is electrically connected to the interconnectors and includes a second semiconductor chip.

15. The method of claim 10, further comprising, after the removing of the silicon substrate, removing part of the barrier layer and the seed layer.

16. The method of claim 15, wherein the barrier layer and the seed layer disposed between the first conductive pads and the redistribution layer and between the second conductive pads and the redistribution layer are not removed.

17. A method of manufacturing a semiconductor package, the method comprising:

forming a plurality of trenches at a first surface of a silicon substrate;

subsequently forming a conductive pad inside each of the plurality of trenches, thereby forming a plurality of conductive pads;

sequentially depositing a barrier layer and a seed layer on the first surface of the silicon substrate;

subsequently forming a package substrate in the form of a redistribution layer on the seed layer, the package substrate connected at a first surface to the conductive pads;

subsequently forming an external connection terminal on a second surface of the package substrate opposite the first surface of the package substrate, the external connection terminal being a solder ball or C4 bump;

subsequently forming an adhesive and a carrier which together entirely cover the external connection terminal;

subsequently removing the silicon substrate and exposing the conductive pads;

subsequently mounting a semiconductor chip to be connected to the conductive pads; and forming an encapsulant to surround at least one surface of the semiconductor chip, wherein a first surface of each conductive pad, which is a top surface of the conductive pad when formed, is concavely formed toward a second surface of the conductive pad, which is opposite to the first surface, and wherein the barrier layer is in contact with the first surfaces of the conductive pads and the first surface of the silicon substrate, and the seed layer is between the barrier layer and the package substrate, and wherein a surface of the seed layer is planar and is at the same level as the first surface of the package substrate.

18. The method of claim 17, further comprising flipping the package substrate after forming the external connection terminal and before mounting the semiconductor chip.

* * * * *